(12) United States Patent
Kuroda et al.

(10) Patent No.: US 9,680,053 B2
(45) Date of Patent: Jun. 13, 2017

(54) NITRIDE SEMICONDUCTOR DEVICE

(71) Applicant: Panasonic Intellectual Property Management Co., Ltd., Osaka (JP)

(72) Inventors: Masayuki Kuroda, Osaka (JP); Manabu Yanagihara, Osaka (JP); Shinichi Oki, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/934,244

(22) Filed: Nov. 6, 2015

(65) Prior Publication Data

US 2016/0064600 A1 Mar. 3, 2016

Related U.S. Application Data

(63) Continuation of application No. PCT/JP2014/001812, filed on Mar. 28, 2014.

(30) Foreign Application Priority Data

May 16, 2013 (JP) .................................. 2013-103673

(51) Int. Cl.
*H01L 33/06* (2010.01)
*H01L 33/00* (2010.01)
(Continued)

(52) U.S. Cl.
CPC .......... *H01L 33/06* (2013.01); *H01L 29/7786* (2013.01); *H01L 29/872* (2013.01);
(Continued)

(58) Field of Classification Search
None
See application file for complete search history.

(56) References Cited

U.S. PATENT DOCUMENTS 9,070,707 B2 * 6/2015 Hasuike ............ H01L 29/66462
2003/0168665 A1 * 9/2003 Kim ........................ H01L 33/34
257/80
(Continued)

FOREIGN PATENT DOCUMENTS

JP 60-110173 6/1985
JP 4-139877 5/1992
(Continued)

OTHER PUBLICATIONS

Furukawa, Yuzo, Hiroo Yonezu, and Akihiro Wakahara. "Monolithic integration of light-emitting devices and silicon transistors." SPIE, Newsroom (2007).*
(Continued)

*Primary Examiner* — William Coleman
*Assistant Examiner* — Kien Ly
(74) *Attorney, Agent, or Firm* — McDermott Will & Emery LLP

(57) ABSTRACT

A nitride semiconductor device includes a transistor having a semiconductor stacked body formed on a substrate, and a pn light-emitting body formed on the semiconductor stacked body. The semiconductor stacked body includes a first nitride semiconductor layer, and a second nitride semiconductor layer formed on the first nitride semiconductor layer and having a bandgap wider than that of the first nitride semiconductor layer. The transistor includes: the semiconductor stacked body; a source electrode and a drain electrode formed away from each other on the semiconductor stacked body; and a gate electrode provided between the source electrode and the drain electrode and formed away from the source electrode and the drain electrode. The pn light-emitting body includes a p-type nitride semiconductor layer and an n-type nitride semiconductor layer to emit a light beam having an energy value higher than an electron trap- (Continued)

ping level existing in the semiconductor stacked body, in which the p-type nitride semiconductor layer of the pn light-emitting body is electrically connected to the gate electrode, and functions as a gate of the transistor.

10 Claims, 12 Drawing Sheets

(51) Int. Cl.
  *H01L 29/778*  (2006.01)
  *H01L 33/32*  (2010.01)
  *H01L 29/20*  (2006.01)
  *H01L 25/16*  (2006.01)
  *H01L 27/15*  (2006.01)
  *H01L 33/18*  (2010.01)
  *H01L 29/872*  (2006.01)
  *H01L 33/36*  (2010.01)

(52) U.S. Cl.
  CPC ...... *H01L 33/0025* (2013.01); *H01L 33/0033* (2013.01); *H01L 33/0041* (2013.01); *H01L 33/18* (2013.01); *H01L 33/32* (2013.01); *H01L 25/167* (2013.01); *H01L 27/15* (2013.01); *H01L 29/2003* (2013.01); *H01L 33/0008* (2013.01); *H01L 33/36* (2013.01); *H01L 2924/0002* (2013.01)

(56) References Cited

U.S. PATENT DOCUMENTS

| | | | | |
|---|---|---|---|---|
| 2005/0210672 A1* | 9/2005 | Reynolds | ........... | G02F 1/155 29/830 |
| 2005/0221628 A1* | 10/2005 | Tanaka | ........... | H01L 29/2003 438/791 |
| 2006/0043380 A1* | 3/2006 | Hiroshi | ........... | H01L 33/0041 257/79 |
| 2007/0145394 A1* | 6/2007 | Shimizu | ........... | H01L 27/1443 257/98 |
| 2009/0321738 A1* | 12/2009 | Kim | ........... | B82Y 10/00 257/59 |
| 2012/0235738 A1 | 9/2012 | Masuda et al. | | |
| 2013/0221368 A1* | 8/2013 | Oraw | ........... | H01L 27/15 257/76 |
| 2013/0320299 A1* | 12/2013 | Li | ........... | H01L 33/06 257/13 |
| 2014/0084346 A1* | 3/2014 | Tajiri | ........... | H01L 29/2003 257/194 |
| 2015/0132870 A1* | 5/2015 | Kalem | ........... | H01L 29/7831 438/22 |

FOREIGN PATENT DOCUMENTS

| | | | | |
|---|---|---|---|---|
| JP | 2006-286746 | | | 10/2006 |
| JP | 2006286746 | A | * | 10/2006 |
| JP | 2008-047767 | | | 2/2008 |
| JP | 2008-198731 | | | 8/2008 |
| JP | 2010-073744 | | | 4/2010 |
| JP | 2010073744 | A | * | 4/2010 |
| JP | 2012-199648 | | | 10/2012 |

OTHER PUBLICATIONS

Kalaitzakis, F. G., et al. "Monolithic integration of nitride-based transistor with Light Emitting Diode for sensing applications." Microelectronic Engineering 90 (2012): 33-36.*

International Search Report of PCT application No. PCT/JP2014/001812 dated Jul. 1, 2014.

Ohno et al., "Current Collapse in GaN HEMTs" Technical Report of IEICE (The Institute of Electronics, Information and Communication Engineers) ICD "Integrated Circuit" Jan. 9, 2002, vol. 101, No. 555, ICD2001-184, p. 19-24.

* cited by examiner

NITRIDE SEMICONDUCTOR DEVICE

RELATED APPLICATIONS

This application is a Continuation of International Application No. PCT/JP2014/001812, filed on Mar. 28, 2014, which in turn claims priority from Japanese Patent Application No. 2013-103673, filed on May 16, 2013, the contents of all of which are incorporated herein by reference in their entireties.

BACKGROUND

1. Field of the Invention

The present disclosure relates to a nitride semiconductor device capable of serving as a power switching element.

2. Description of the Related Art

Gallium nitride (GaN) has a bandgap of 3.4 eV which is about three times wider than Si having a bandgap of 1.1 eV. Therefore, GaN has a high breakdown voltage. In addition, GaN has a high electron saturation velocity, so it has an excellent feature that a high-frequency operation can be performed. Especially, an ON-resistance (Ron) while a field effect transistor (FET) is in an ON-state can be considerably low compared with that of Si-based FET at the same breakdown voltage. As a result, a cooling system can be expected to be simpler, smaller, and lighter, so that a power element can be expected to be extremely low in power loss and used as an alternative to a Si power element. At the present, a metal-oxide semiconductor (MOS) FET or an insulated gate bipolar transistor (IGBT) made of Si is used as a power device, but its performance is approaching theoretical limitations, so that a power device made of GaN which is superior in material value to Si is drawing attention.

When the GaN power device is used as a key component in a power conversion control device such as an inverter, an energy-saving effect can be achieved in consumer equipment as one of energy-saving effects. When an operation frequency is increased and a switching operation is performed at high speed in the power conversion control device, a peripheral component such as an inductor can be small in size, and a power supply circuit can be miniaturized. However, in this case, a switching loss is increased, so that improvement in efficiency at a high frequency of 100 kHz or more is limited in the conventional Si power semiconductor. Meanwhile, when the GaN power device which has a high electron saturation velocity and a high breakdown electric field strength is used, a drift region can be reduced in size, and not only a switching loss but also a conduction loss can be reduced, so that even when a high-speed switching operation is performed, the loss can be lower than that of the Si power device.

For purpose of improving switching characteristics of the GaN device, there is a need to prevent a current collapse which is caused by a considerable reduction in drain current when a high drain bias is applied, and an increase in ON-resistance.

As a mechanism of the current collapse, it is considered that electrons accelerated by a high intensity of electric field, which become hot electrons, are trapped in an electron trap due to a crystal defect or a surface level, so that the drain current is reduced and the ON-resistance is increased. The increase in ON-resistance causes the switching characteristics to deteriorate, so that preventing the current collapse is indispensable in order to increase an output and reduce a loss in a GaN power device.

For purpose of preventing the current collapse in the GaN device, it is disclosed that a light emitting diode (LED) is formed for light irradiation, on a back surface or a front surface of an FET (refer to Unexamined Japanese Patent Publication No. 2006-286746). Furthermore, it is reported that an FET and an LED for irradiating the FET with light beams are formed on a chip, and the FET is irradiated with the light beams to prevent the current collapse (refer to Unexamined Japanese Patent Publication No. 2008-47767).

SUMMARY

A nitride semiconductor device according to an aspect of the present disclosure includes a transistor having a semiconductor stacked body formed on a substrate, and a pn light-emitting body formed on the semiconductor stacked body. The semiconductor stacked body includes a first nitride semiconductor layer, and a second nitride semiconductor layer formed on the first nitride semiconductor layer and having a bandgap wider than that of the first nitride semiconductor layer. The transistor includes: the semiconductor stacked body; a source electrode and a drain electrode formed away from each other on the semiconductor stacked body; and a gate electrode provided between the source electrode and the drain electrode and formed away from the source electrode and the drain electrode. The pn light-emitting body includes a p-type nitride semiconductor layer and an n-type nitride semiconductor layer to emit a light beam having an energy value higher than an electron trapping level existing in the semiconductor stacked body, in which the p-type nitride semiconductor layer of the pn light-emitting body is electrically connected to the gate electrode, and functions as a gate of the transistor.

Due to this configuration, the trapped electrons can be released with light emission energy of the LED, so that the current collapse can be efficiently prevented.

DETAILED DESCRIPTION OF THE PREFERRED EMBODIMENTS

According to a nitride semiconductor device disclosed in Unexamined Japanese Patent Publication No. 2006-286746, since the LED is formed on the back or front surface of the FET, the light emitting source is disposed at a position away from an electric field concentration part, so that the current collapse cannot be sufficiently prevented. Furthermore, there is a need to add the step of forming the LED on the back or front surface of the FET, which increases a manufacturing cost.

Furthermore, according to a nitride semiconductor device disclosed in Unexamined Japanese Patent Publication No. 2008-47767, since the LED is formed outside a unit cell of the FET, the LED is relatively distant from an electric field concentration part, so that the effect of light irradiation is reduced because the light emission is attenuated or the light beam is absorbed in a defect level, or the light beam passes through an electrode made of non-transmissive material. Consequently, the current collapse cannot be sufficiently prevented. Furthermore, the region for forming the LED is to be added on the chip, so that a chip is increased in size. Furthermore, according to a disclosed manufacturing method, since there is a need to add a step of re-growing a semiconductor layer in order to form the LED in addition to the FET, the problem is that a manufacturing cost is increased.

According to the nitride semiconductor device in the present disclosure, in view of the above problems, without increasing a chip size or substantially adding a manufacturing step, the LED is disposed closer to an electric field concentration part, and electrons trapped at a high voltage can be released with the light emission of the LED, so that the current collapse can be prevented.

In order to solve the above problems, the nitride semiconductor device in the present disclosure has the following configuration.

Figure 1:
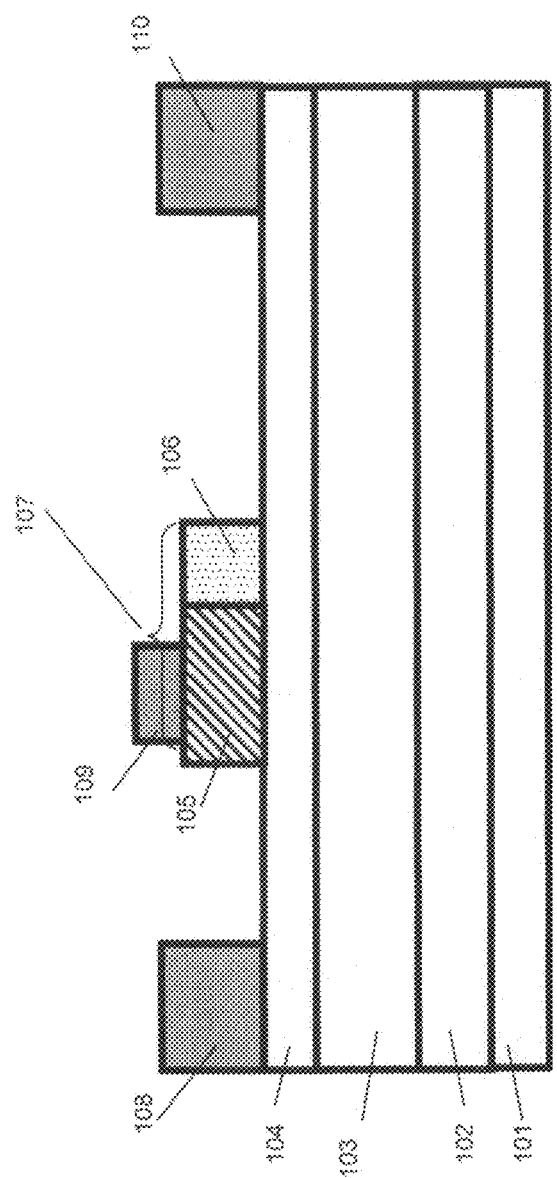
FIG. 1 is a schematic view showing a nitride semiconductor device in a first exemplary embodiment.

FIG. 1 is a schematic view showing a nitride semiconductor device in a first exemplary embodiment. As shown in FIG. 1, first nitride semiconductor layer (hereinafter, referred to as first layer) 103 is disposed on substrate 101. A second nitride semiconductor layer (hereinafter, referred to as second layer) 104 is disposed on first layer 103. Source electrode 108 serving as a first electrode, drain electrode 110 serving as a second electrode, and pn light-emitting body 107 are disposed on second layer 104. A bandgap of second layer 104 is wider than a bandgap of first layer 103. Furthermore, pn light-emitting body 107 has p-type nitride semiconductor layer (hereinafter, referred to as p layer) 105, and n-type nitride semiconductor layer (hereinafter, referred to as n layer) 106. A light emission energy value of pn light-emitting body 107 is higher than an electron trapping level existing in first layer 103, and higher than an electron trapping level existing in second layer 104.

Due to this configuration, the trapped electrons can be released with the light emission energy of pn light-emitting body 107, so that the current collapse can be efficiently prevented.

Hereinafter, a more specific configuration including a given configuration will be described.

In the present disclosure, being "disposed on (or formed on)" a layer (or a substrate) means both of being disposed on (or formed on) and in contact with the layer (or the substrate), and being disposed on (or formed on) the layer (or the substrate) with another layer interposed therebetween. Furthermore, AlGaN represents ternary mixed crystals $Al_xGa_{1-x}N$ ($0 \le x \le 1$). Multiple mixed crystals are represented by a series of constituent element symbols abbreviated to such as AlInN or GaInN. For example, a nitride semiconductor $Al_xGa_{1-x-y}In_yN$ ($0 \le x \le 1$, $0 \le y \le 1$, $x+y \le 1$) is abbreviated to AlGaInN. Furthermore, the term "undoped" means that impurities are intentionally not doped. Furthermore, p+ means that high-concentration p-type carriers are contained. Hereinafter, the nitride semiconductor device in the exemplary embodiment of the present disclosure will be described with reference to the drawings.

First Exemplary Embodiment

FIG. 1 is a schematic view of the nitride semiconductor device according to the first exemplary embodiment. The nitride semiconductor device in this exemplary embodiment is a field effect transistor (FET).

As shown in FIG. 1, buffer layer 102 made of nitride semiconductor is formed on electrically-conductive substrate 101 made of silicon (Si). First layer 103 made of undoped GaN and having an electron trapping level (Et shown in FIG. 5) in a bandgap is formed on buffer layer 102. Second layer 104 having a bandgap wider than the bandgap of first layer 103 is formed on first layer 103. Second layer 104 has an electron trapping level in the bandgap. First layer 103 may be composed of an undoped GaN layer having a thickness of about 2 μm, for example. Second layer 104 may be composed of an undoped AlGaN layer having a thickness of about 25 nm, for example.

Electric charges are generated near a hetero junction between first layer 103 and second layer 104 due to spontaneous polarization and Piezoelectric polarization. Thus, a channel region is generated as a two-dimensional electron gas (2DEG) layer having a sheet carrier concentration of $1 \times 10^{13}$ cm$^{-2}$ or more and mobility of 1500 cm$^2$V/sec or more. Here, the electron trapping level means an energy level generated due to a defect or impurities in a semiconductor crystal. When free electrons are trapped in the trapping level at a high voltage, a current collapse is caused. A concentration of electrons contributing to conduction is determined by electrons excited by a donor and fixed charges due to polarization, and activation energy of the trapping level (Ea shown in FIG. 5) corresponds to a depth of the trapping level from a bottom of a conduction band (Ec shown in FIG. 5).

Here, p layer 105 is formed on second layer 104. In addition, p layer 105 is made of p-type InAlGaN doped with magnesium (Mg), and preferably made of p-type GaN. A thickness of p layer 105 is between 10 nm and 400 nm (inclusive) which is lower than a height of an upper surface of source electrode 108 or drain electrode 110, and preferably 100 nm. A hole concentration of p layer 105 is preferably $1 \times 10^{16}$ cm$^{-3}$ to $1 \times 10^{19}$ cm$^{-3}$. Thus, even if a voltage of 0 V is applied to gate electrode 109, a depletion layer is formed in both second layer 104 and first layer 103, and extends from p layer 105 toward substrate 101 and toward drain electrode 110. Therefore, a current flowing in the channel region is interrupted, so that a normally-OFF operation can be performed. In addition, p layer 105 may be composed of an AlGaN layer. When the normally-OFF operation is not required, p layer 105 is not necessarily provided. The normally-OFF operation can be realized by adjusting the thickness of second layer 104, or forming a gate recess instead of providing p layer 105. Here, source electrode 108 and drain electrode 110 are formed on second layer 104 so as to be away from each other and make ohmic contacts with the channel layer. A distance between p layer 105 and drain electrode 110 is designed so that the nitride semiconductor device in this exemplary embodiment can withstand a maximum applied voltage. Gate electrode 109 is formed on p layer 105.

Furthermore, n layer 106 is made of n-type InAlGaN doped with Si such as silane (SiH$_4$) and preferably made of GaN. A thickness of n layer 106 is between 10 nm and 400 nm (inclusive) which is lower than a height of the upper surface of source electrode 108 or drain electrode 110, and preferably 100 nm. In addition, n layer 106 may be formed by selectively growing the crystal again after a step of dry etching for p layer 105. Alternatively, n layer 106 may be formed by implanting Si ions after forming an undoped GaN layer and performing an activation annealing process. Ohmic electrodes are formed for p layer 105 and n layer 106, and preferably made of Ni-based and Al-based electrode materials, respectively. The Ni-based and Al-based electrode materials do not transmit a visible light beam, so that if the electrode exists between pn light-emitting body 107 and an electric field concentration part, the light beam emitted from pn light-emitting body 107 is absorbed, and the light beam is attenuated and unlikely to reach the electric field concentration part. Therefore, as far as a desired potential is applied to p layer 105 and n layer 106, p layer 105 or n layer 106 may be in contact with the electrode on an upper surface or a side surface of a finger or in a region outside an activation region.

Table 1 shows the conductivity types, and specific values of the thicknesses and the carrier concentrations of the above nitride semiconductor device, and Table 2 shows configurations of the electrode metals.

TABLE 1

| | Composition | Conductivity type | Carrier concentrations | Thickness |
|---|---|---|---|---|
| 101 | — | p type | $1 \times 10^{18}$ cm$^{-3}$ | 675 µm |
| 102 | AlGaN | i type | $<1 \times 10^{16}$ cm$^{-3}$ | 1 µm |
| 103 | GaN | i type | $<1 \times 10^{16}$ cm$^{-3}$ | 2 µm |
| 104 | AlGaN | i type | $<1 \times 10^{16}$ cm$^{-3}$ | 25 nm |
| 105 | GaN | p type | $1 \times 10^{16}$ cm$^{-3}$ to $1 \times 10^{19}$ cm$^{-3}$ | 100 nm |
| 106 | GaN | n type | $1 \times 10^{16}$ cm$^{-3}$ to $1 \times 10^{19}$ cm$^{-3}$ | 100 nm |

TABLE 2

| | Metal kind | Thickness |
|---|---|---|
| 108 | Al | 400 nm |
| 109 | Ni | 400 nm |
| 110 | Al | 400 nm |

Figure 2:
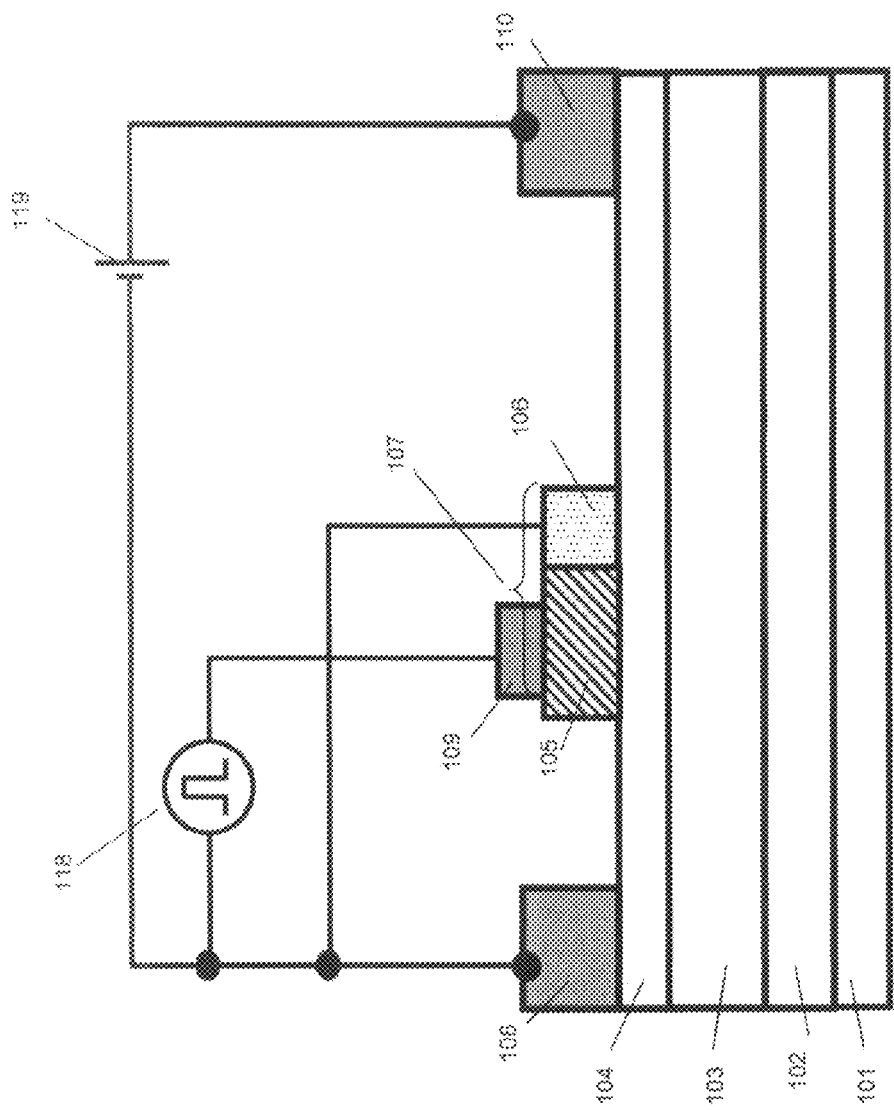
FIG. 2 is a schematic view showing a switching operation of the nitride semiconductor device in the first exemplary embodiment.
Figure 3:
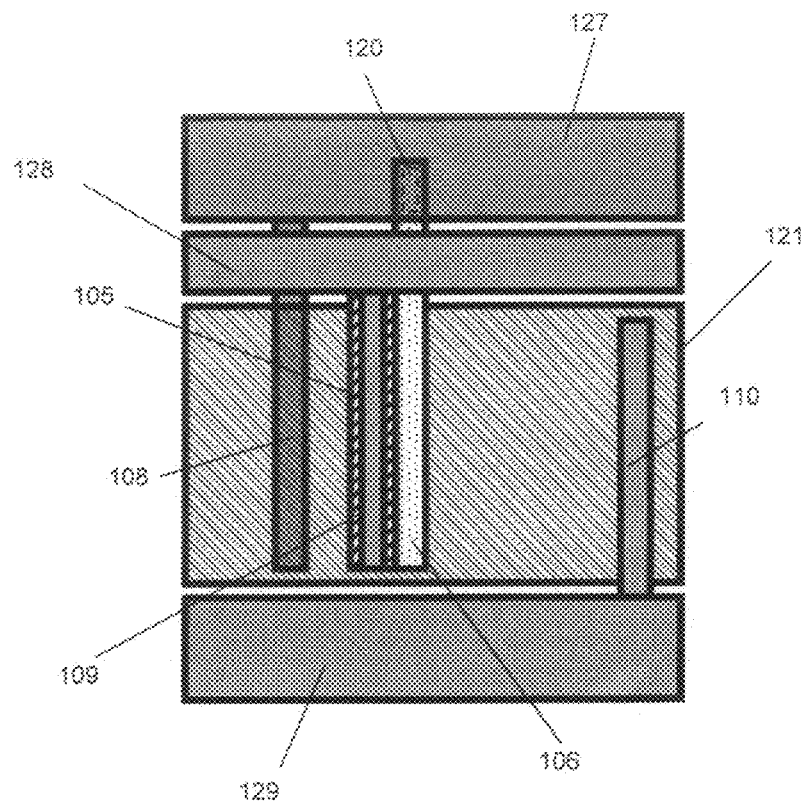
FIG. 3 is a plan view of the nitride semiconductor device in the first exemplary embodiment.

FIG. 2 is a schematic view showing a switching operation of the nitride semiconductor device in the first exemplary embodiment. FIG. 3 is a plan view of the nitride semiconductor device including wiring lines in the first exemplary embodiment. Referring to FIG. 2, a potential difference is generated between source electrode 108 and drain electrode 110 by power supply 119. Furthermore, referring to FIG. 3, source electrode 108 extends from source pad 127 toward active region 121 of the FET, and gate electrode 109 extends from gate pad 128 toward active region 121 of the FET. In addition, drain electrode 110 extends from drain pad 129 toward active region 121 of the FET. Furthermore, n layer 106 is electrically connected to source pad 127 in contact part 120.

As shown in FIGS. 2 and 3, n layer 106 has substantially the same potential as source electrode 108, and pn light-emitting body 107 is driven by gate signal 118. Due to this configuration, a dimensional margin of the electrode to feed a current to pn light-emitting body 107 is only to be taken into consideration for the p-type ohmic electrode, so that pn light-emitting body 107 can be formed without a considerable increase in pitch size. In addition, the electrode is formed for pn light-emitting body 107 similarly in the following exemplary embodiments.

Here, pn light-emitting body 107 has at least p layer 105 and n layer 106. In this case, pn light-emitting body 107 may include an intermediate layer made of undoped InAlGaN between p layer 105 and n layer 106. A thickness of the InAlGaN intermediate layer is between 1 nm and 100 nm (inclusive), and preferably 10 nm. Furthermore, when bandgap energy of the undoped InAlGaN intermediate layer is set smaller than bandgap energy of p layer 105 and n layer 106, pn light-emitting body 107 has a quantum well configuration. Thus, pn light-emitting body 107 can be improved in emission efficiency due to a confinement effect to the quantum well. When a voltage higher than a threshold voltage of a forward bias between pn junctions is applied, pn light-emitting body 107 having at least p layer 105 and n layer 106 emits a light beam having a light emission wavelength corresponding to its bandgap energy.

One of factors that the current collapse is caused in the GaN transistor is considered that electrons are trapped in second layer 104 made of AlGaN or first layer 103 made of GaN. The phenomenon that the electrons are trapped in the AlGaN layer or the GaN layer could be caused because electrons are generated due to impact ionization. While the GaN transistor is in an OFF-state, a potential of drain electrode 110 becomes high, so that a high electric field region is generated due to a potential difference between the gate and the drain. Electric force lines from drain electrode 110 toward gate electrode 109 concentrate at a gate end, closer to the drain, on p layer 105. That is, the electrons accelerated by the electric field concentration at the gate end become impact ions, and they are trapped in the trap level of first layer 103 or second layer 104. When the electrons are trapped in first layer 103 or second layer 104 while the GaN transistor is in the OFF-state, a depletion layer is formed in a semiconductor stacked body of first layer 103 and second layer 104 at the moment when the GaN transistor is turned on, so that a drain current is constricted. Thus, the ON-resistance is increased and the current collapse is caused.

According to the nitride semiconductor device in this exemplary embodiment, when the gate signal is applied to turn on the transistor, a depletion layer width under p layer 105 is narrowed and a channel is turned on, and at the same time, a forward bias is applied to pn light-emitting body 107. As a result, pn light-emitting body 107 emits the light beam having the light emission wavelength corresponding to its bandgap energy. A pulse voltage of the gate signal is to be set so as to be higher than the threshold voltage of the forward bias of the pn junction, and not to deteriorate the pn junction. Preferably, a forward turn-on voltage of the pn junction in the nitride semiconductor is about 3.2 V, and the voltage to be applied to the pn light-emitting body 107 is +4 V.

In addition, pn light-emitting body 107 is disposed lower than the upper surface of the electrode, so that even when the electrode is made of the non-transmissive material, the light beam can reach an inside of the semiconductor stacked body composed of first layer 103 and second layer 104 over a wide range at a wavelength capable of releasing the electrons trapped in the electron trapping level.

Figure 4:
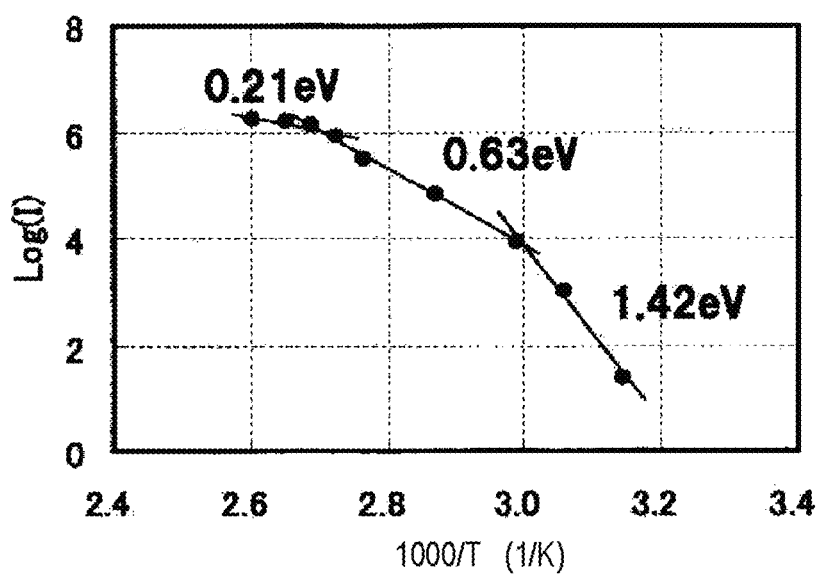
FIG. 4 is a graph showing an Arrhenius plot, and obtained activation energy of an electron trapping level in the nitride semiconductor device according to the first exemplary embodiment.

FIG. 4 shows an Arrhenius plot, and obtained activation energy of the electron trapping level in the nitride semiconductor device according to the present disclosure. The activation energy of the electron trapping level of first layer 103 and second layer 104 is 0.21 eV, 0.63 eV, and 1.42 eV. When they are converted to wavelengths, the wavelengths are 5.88 μm, 1.96 μm, and 869 nm, respectively. It is considered that the activation energy of 0.21 eV is the trapping level caused by a defect of the surface, and the activation energy of 0.63 eV and 1.42 eV are trapping levels caused by a defect of the crystal.

Figure 5:
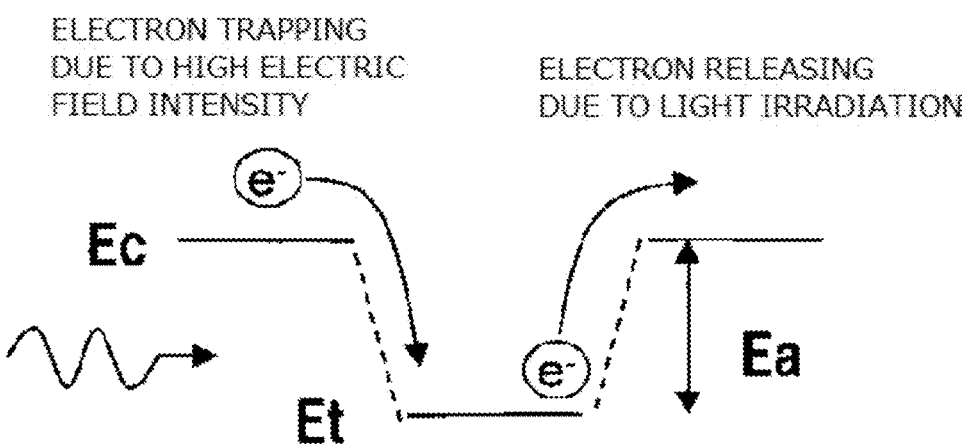
FIG. 5 is a schematic view showing a mechanism to prevent a current collapse of the nitride semiconductor device in the first exemplary embodiment.

FIG. 5 is a schematic view showing a mechanism to prevent the current collapse of the nitride semiconductor device in the present disclosure. When the electrons trapped in the electron trapping level at the high voltage are irradiated with the light beam having energy higher than the activation energy of the trapping level, the electrons are excited with the light beam and released from the trap. Here, a relationship between the light emission energy and a frequency ν is expressed such that $E=h\nu$ (h is a Plank's constant). The light emission energy from pn light-emitting body 107 is higher than the activation energy of the electron trapping level in the first layer 103 and second layer 104, and preferably 0.2 eV or more. According to this exemplary embodiment, the light beam emitted from pn light-emitting body 107 has the light emission energy of 3.2 eV, for example. This is 386 nm in terms of the wavelength. The electric field concentration part at the gate end in first layer 103 or second layer 104 is irradiated with the light beam emitted from pn light-emitting body 107. According to the nitride semiconductor device in this exemplary embodiment, the electrons trapped in the electron trapping levels having the activation energy of 0.21 eV, 0.63 eV or 1.42 eV can be released by the light beam emitted from pn light-emitting body 107, so that the current collapse can be prevented.

Figure 6:
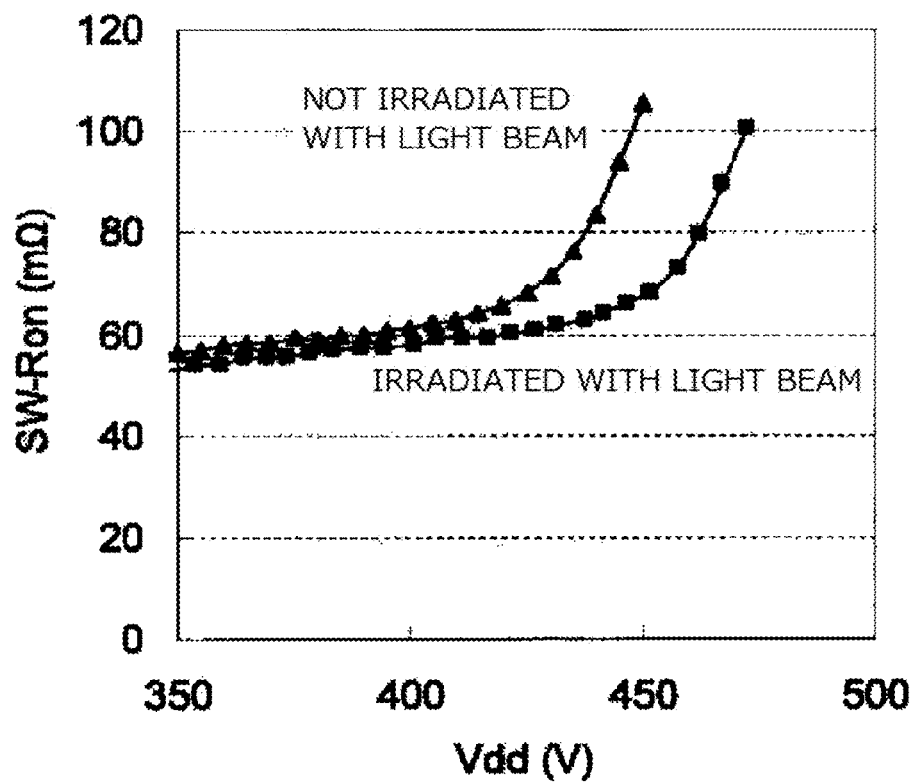
FIG. 6 is a graph showing a relationship between an ON-resistance and a power supply voltage in the nitride semiconductor device in the first exemplary embodiment and a conventional nitride semiconductor device.

FIG. 6 is a view showing a relationship between an ON-resistance and a power supply voltage in the nitride semiconductor device according to this exemplary embodiment, and a conventional nitride semiconductor device. Here, the ON-resistance means an ON-resistance just after the switching operation has been performed from an OFF-state to an ON-state. More specifically, it is the ON-resistance provided after 5 μs. According to the nitride semiconductor device in the present disclosure, the current collapse can be prevented, and a turn-on voltage of the ON-resistance can be higher than the conventional nitride semiconductor device. As emission intensity from the pn light-emitting body 107 is increased, an amount of photons which reach the trapped electrons is increased, so that the more electrons can be released from the trap and contribute to the conduction, whereby the ON-resistance is reduced. Thus, the emission intensity is to be as high as possible. Preferably, when a luminous flux is 8 lumen (lm) or more, the current collapse can be prevented as shown in FIG. 6.

Furthermore, pn light-emitting body 107 may not be integrated with gate electrode 109 as far as it is formed on second layer 104, which is the same in the following exemplary embodiments of the present disclosure. In addition, pn light-emitting body 107 may be formed as an n-type layer composed of high-concentration two-dimensional electron gas generated at an interface between first layer 103 and second layer 104 due to spontaneous polarization or Piezoelectric polarization.

Furthermore, pn light-emitting body 107 has the configuration in which p layer 105 is formed closer to source electrode 108 and n layer 106 is formed closer to drain electrode 110, but n layer 106 may be formed closer to source electrode 108 and p layer 105 may be formed closer to drain electrode 110. Furthermore, a plurality of pn light-emitting bodies 107 may be provided. In addition, as far as the current collapse can be prevented by the light beam emitted from pn light-emitting body 107, n layer 106 is not necessarily connected electrically to source electrode 108. Furthermore, pn light-emitting bodies 107 may be disposed between source electrode 108, gate electrode 109, and drain electrode 110, or may be disposed outside the three electrodes. As for voltage supply to all pn light-emitting bodies 107, the gate-source voltage or the gate-drain voltage may be supplied as it is, or supplied after it is divided. Due to this configuration, additional power supply is not required, and the current collapse can be prevented without reducing the breakdown voltage. Furthermore, the light beam may be emitted from pn light-emitting body 107 not only in the ON-state, but also in the OFF-state, or both in the ON-state and the OFF-state.

As described above, since the nitride semiconductor device in this exemplary embodiment includes pn light-emitting body 107 serving as the light emission source in the active region of the unit cell in the transistor, the current collapse can be efficiently prevented due to the light emission of pn light-emitting body 107 without increasing a chip size.

First Variation of First Exemplary Embodiment

Figure 7:
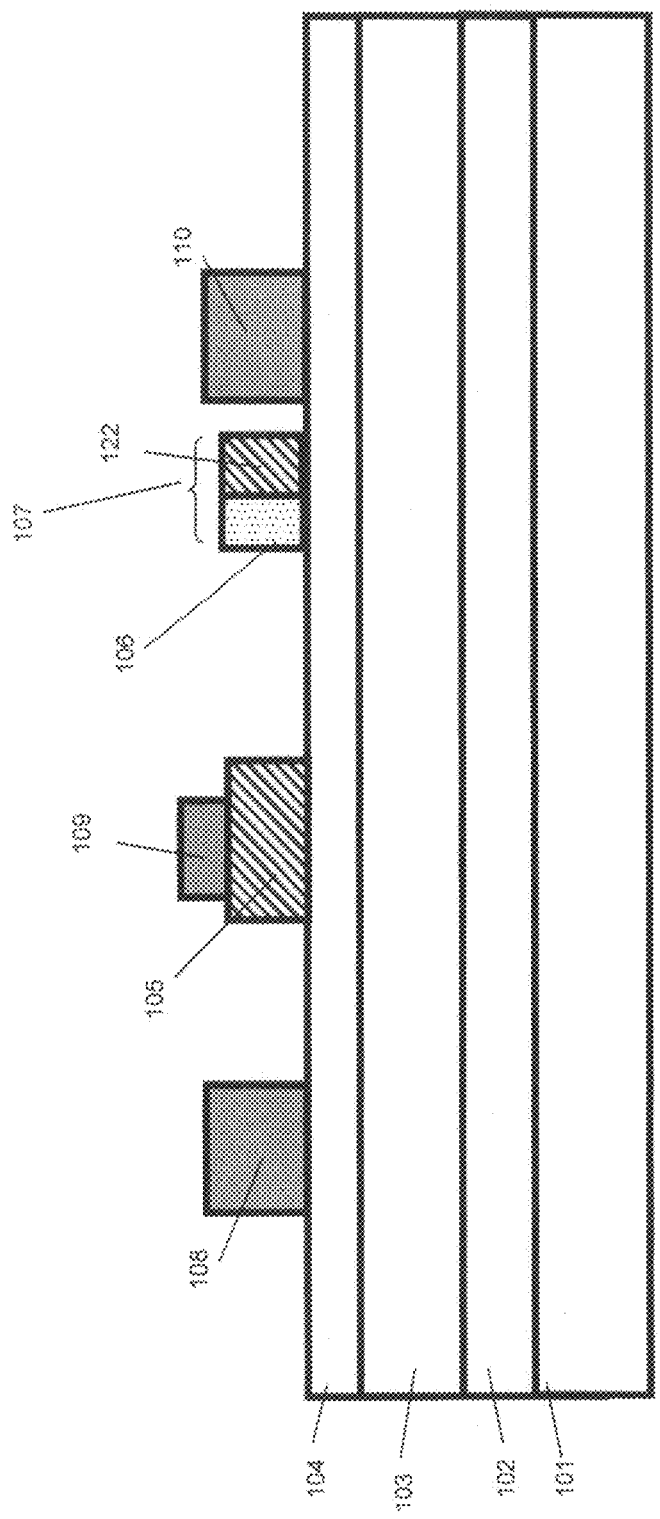
FIG. 7 is a schematic view showing a nitride semiconductor device in a first variation of the first exemplary embodiment.

FIG. 7 is a schematic view showing a nitride semiconductor device according to the first variation of the first exemplary embodiment. The nitride semiconductor device in this variation is a field effect transistor (FET).

According to the first variation, second p layer 122 is formed on second layer 104 so as to be disposed between gate electrode 109 and drain electrode 110 and not to be in contact with gate electrode 109 which controls the ON/OFF of the transistor. Second p layer 122 is made of p-type InAlGaN doped with magnesium (Mg), and preferably made of p-type GaN. A thickness of second p layer 122 is between 10 nm and 400 nm (inclusive) which is lower than a height of an upper surface of source electrode 108 or drain electrode 110 and preferably 100 nm. Second p layer 122 preferably has a hole concentration of $1 \times 10^{16}$ cm$^{-3}$ to $1 \times 10^{19}$ cm$^{-3}$.

In addition, n layer 106 is formed so as to be in contact with second p layer 122, whereby pn light-emitting body 107 is formed. Second p layer 122 is connected to drain electrode 110, so that when a high drain voltage is applied while the transistor is in the OFF-state, a forward current flows in pn light-emitting body 107 due to a potential difference between drain electrode 110 and n layer 106 and the light beam is emitted. A distance between pn light-emitting body 107 and gate electrode 109 is designed so that the nitride semiconductor device in the present disclosure can withstand a maximum applied voltage. Furthermore, as far as a desired potential can be applied to second p layer 122 and n layer 106, second p layer 122 or n layer 106 may be in contact with the electrode on an upper surface or a side surface of a finger, or a region other than an active region.

Furthermore, as for the semiconductor device shown in FIG. 7, the parameters of each layer except for second p layer 122 and the configurations of metal electrodes are the same as in Table 1 and Table 2.

Figure 8:
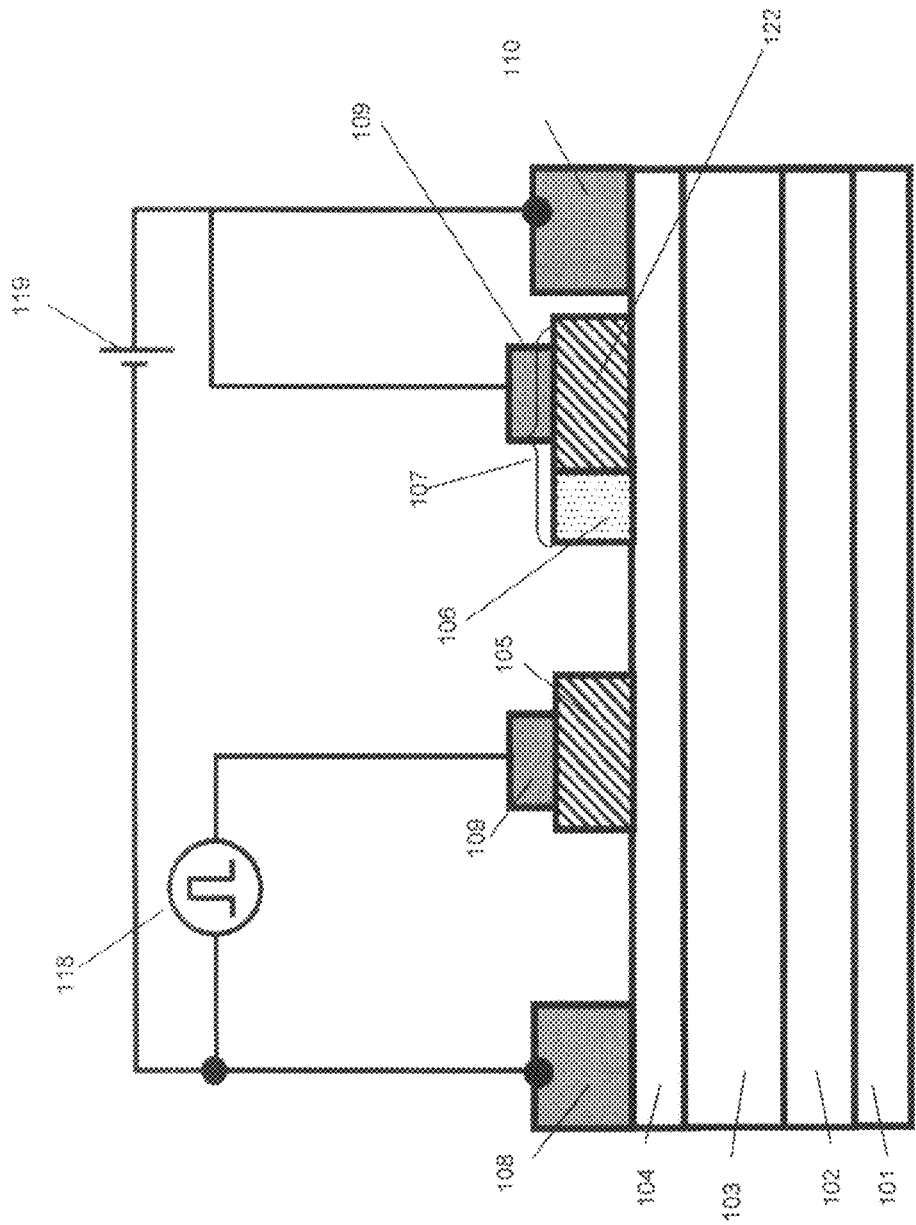
FIG. 8 is a schematic view showing a switching operation of the nitride semiconductor device in the first variation of the first exemplary embodiment.

FIG. 8 is a schematic view showing a switching operation of the nitride semiconductor device in the first variation. The configuration shown in FIG. 8 is similar to that shown in FIG. 2.

Preferably, second p layer 122 is electrically connected to drain electrode 110 at an end of a gate finger (not shown), and has substantially the same potential as drain electrode 110. Thus, pn light-emitting body 107 may be driven by a potential drop generated due to an access-resistance of the second dimensional electron gas formed between drain electrode 110 and pn light-emitting body 107 in a transition period from the ON-state to the OFF-state.

Second Exemplary Embodiment

Figure 9:
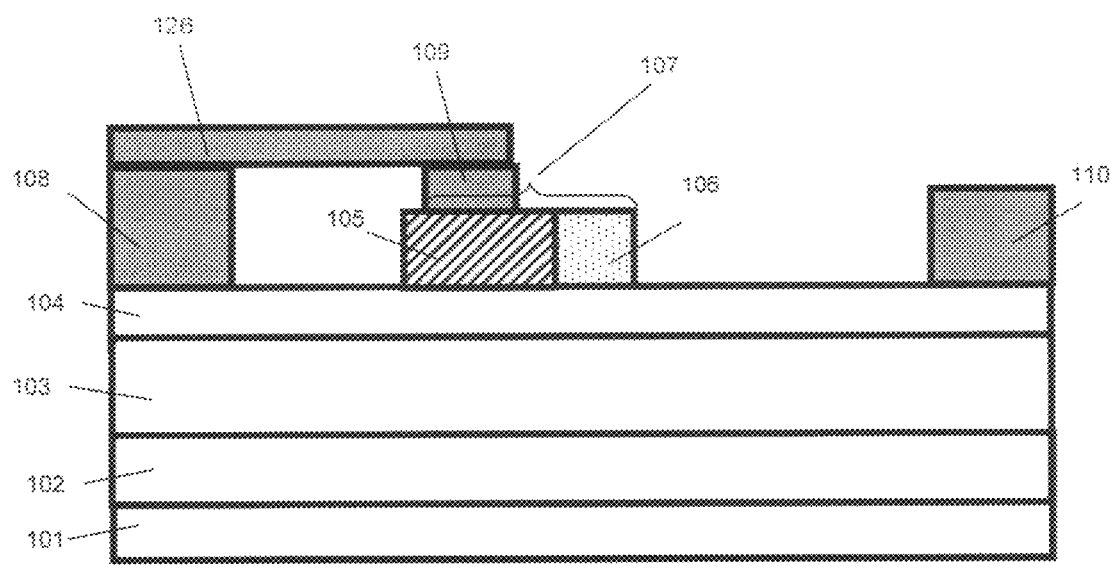
FIG. 9 is a schematic view showing a nitride semiconductor device according to a second exemplary embodiment.

FIG. 9 is a schematic view showing a configuration of a nitride semiconductor device according to the second exemplary embodiment. The nitride semiconductor device in this exemplary embodiment is a field effect transistor (FET).

The nitride semiconductor device in this exemplary embodiment differs from the nitride semiconductor device in the first exemplary embodiment shown in FIG. 1 in that gate-source connection terminal 126 is formed to electrically connect gate electrode 109 to source electrode 108. Here, gate-source connection terminal 126 serves as gate electrode 109, source electrode 108, or an independent wiring line. Gate-source connection terminal 126 may be made of wiring metal such as Au or Al.

Furthermore, as for the semiconductor device shown in FIG. 9, parameters of each layer except for gate-source terminal 126 and configurations of metal electrodes are similar to those in Table 1 and Table 2 described above.

According to this exemplary embodiment, in the case where gate electrode 109 and source electrode 108 are electrically short-circuited and a two-terminal diode is provided, similarly to the above, by irradiating electrons trapped in a trapping level between gate electrode 109 and drain electrode 110 with a light beam having energy higher than activation energy of the trapping level, the trapped electrons can be excited and released from the trap.

Third Exemplary Embodiment

Figure 10:
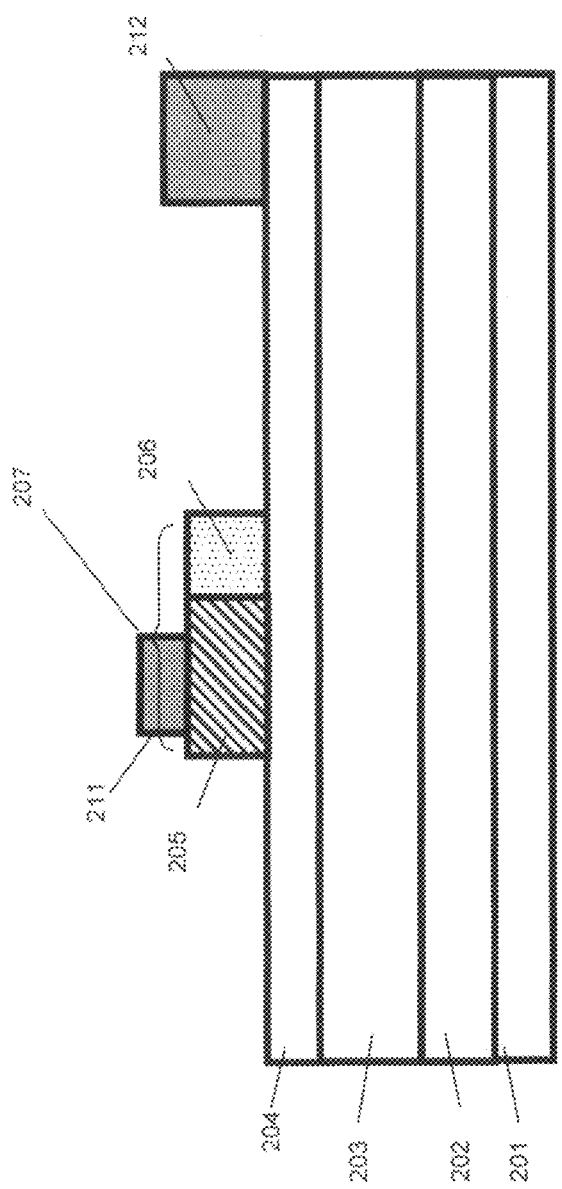
FIG. 10 is a schematic view showing a nitride semiconductor device in a third exemplary embodiment.

FIG. 10 is a schematic view showing a configuration of a nitride semiconductor device according to the third exemplary embodiment. The nitride semiconductor device in this exemplary embodiment is a two-terminal diode.

As shown in FIG. 10, buffer layer 202 made of nitride semiconductor is disposed on electrically-conductive substrate 201 made of silicon (Si). First layer 203 is disposed on buffer layer 202 made of nitride semiconductor. First layer 203 is made of undoped GaN and has an electron trapping level in a bandgap. Second layer 204 is disposed on first layer 203. A bandgap of second layer 204 is wider than the bandgap of first layer 203. Second layer 204 has an electron trapping level in the bandgap. First layer 203 may be composed of an undoped GaN layer having a thickness of about 2 μm, for example. Second layer 204 may be composed of an undoped AlGaN layer having a thickness of about 25 nm, for example.

Furthermore, p layer 205 is formed on second layer 204. In addition, p layer 205 is made of p-type InAlGaN doped with magnesium (Mg), and preferably made of p-type GaN. A thickness of p layer 205 is between 10 nm and 400 nm (inclusive) which is lower than a height of an upper surface of anode electrode 211 or cathode electrode 212, and preferably 100 nm. A hole concentration of p layer 205 is desirably $1 \times 10^{16}$ cm$^{-3}$ to $1 \times 10^{19}$ cm$^{-3}$.

Furthermore, n layer 206 is made of n-type InAlGaN doped with silane (SiH$_4$), for example, and preferably made of GaN. A thickness of n layer 206 is between 10 nm and 400 nm (inclusive) which is lower than the height of the upper surface of anode electrode 211 or cathode electrode 212, and preferably 100 nm. In addition, n layer 206 may be formed by selectively growing the crystal again after a step of dry etching for p layer 205. Alternatively, n layer 206 may be formed by implanting Si ions after forming an undoped GaN layer and performing an activation annealing process. Ohmic electrodes are formed for p layer 205 and n layer 206, and preferably made of Ni-based and Al-based electrode materials, respectively. As far as a desired potential is applied to p layer 205 and n layer 206, p layer 205 or n layer 206 may be in contact with the electrode in an upper surface or a side surface of a finger or in a region outside an activation region.

Table 3 shows the conductivity types, and the specific values of the thicknesses and the carrier concentrations of the above nitride semiconductor device, and Table 4 shows configurations of the electrode metals.

TABLE 3

| | Composition | Conductivity type | Carrier concentrations | Thickness |
|---|---|---|---|---|
| 201 | — | p type | $1 \times 10^{18}$ cm$^{-3}$ | 675 μm |
| 202 | AlGaN | i type | <$1 \times 10^{16}$ cm$^{-3}$ | 1 μm |
| 203 | GaN | i type | <$1 \times 10^{16}$ cm$^{-3}$ | 2 μm |
| 204 | AlGaN | i type | <$1 \times 10^{16}$ cm$^{-3}$ | 25 nm |
| 205 | GaN | p type | $1 \times 10^{16}$ cm$^{-3}$ to $1 \times 10^{19}$ cm$^{-3}$ | 100 nm |
| 206 | GaN | n type | $1 \times 10^{16}$ cm$^{-3}$ to $1 \times 10^{19}$ cm$^{-3}$ | 100 nm |

TABLE 4

| | Metal kind | Thickness |
|---|---|---|
| 211 | Ni | 400 nm |
| 212 | Al | 400 nm |

Thus, pn light-emitting body 207 has at least p layer 205 and n layer 206. Here, an intermediate layer made of undoped InAlGaN may exist between p layer 205 and n layer 206. A thickness of the InAlGaN intermediate layer is between 1 nm and 100 nm (inclusive), and preferably 10 nm. Furthermore, if bandgap energy of the undoped InAlGaN intermediate layer is set smaller than bandgap energy of p layer 205 and n layer 206, pn light-emitting body 207 may have a quantum well configuration. Thus, pn light-emitting body 207 can be improved in emission efficiency due to a confinement effect to the quantum well. When a voltage higher than a threshold voltage of a forward bias between pn junctions is applied, pn light-emitting body 207 having at least p layer 205 or n layer 206 emits a light beam having a light emission wavelength corresponding to its bandgap energy.

According to the nitride semiconductor device in this exemplary embodiment, in the case where the two-terminal diode is provided, similarly to the above, by irradiating electrons trapped in a trapping level between the anode and the cathode with a light beam having energy higher than activation energy of the trapping level, the trapped electrons can be excited and released from the trap.

Fourth Exemplary Embodiment

Figure 11:
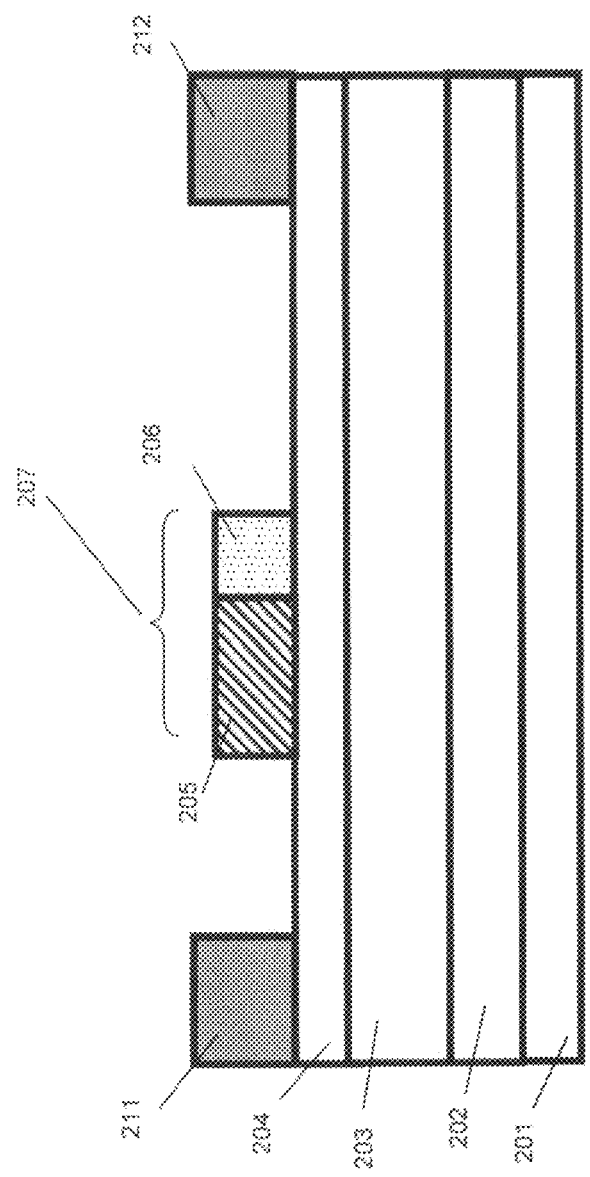
FIG. 11 is a schematic view showing a nitride semiconductor device in a fourth exemplary embodiment.

FIG. 11 is a schematic view showing a configuration of a nitride semiconductor device according to the fourth exemplary embodiment. The nitride semiconductor device in this exemplary embodiment is a Schottky diode (SD).

As shown in FIG. 11, buffer layer 202 made of nitride semiconductor is disposed on conductive substrate 201 made of silicon (Si). First layer 203 is disposed on buffer layer 202. First layer 203 is made of undoped GaN and has an electron trapping level in a bandgap. Second layer 204 is disposed on first layer 203. A bandgap of second layer 204 is wider than the bandgap of first layer 203. Second layer 204 has an electron trapping level in the bandgap. First layer 203 may be composed of an undoped GaN layer having a thickness of about 2 μm, for example. Second layer 204 may be composed of an undoped AlGaN layer having a thickness of about 25 nm, for example.

Furthermore, p layer 205 is formed on second layer 204. In addition, p layer 205 is made of p-type InAlGaN doped with magnesium (Mg), and preferably made of p-type GaN. A thickness of p layer 205 is between 10 nm and 400 nm (inclusive) which is lower than a height of an upper surface of anode electrode 211 or cathode electrode 212, and preferably 100 nm. A hole concentration of p layer 205 is desirably $1\times10^{16}$ cm$^{-3}$ to $1\times10^{19}$ cm$^{-3}$.

Furthermore, n layer 206 is made of n-type InAlGaN doped with silane (SiH$_4$), for example, and preferably made of GaN. A thickness of n layer 206 is between 10 nm and 400 nm (inclusive) which is lower than the height of the upper surface of anode electrode 211 or cathode electrode 212, and preferably 100 nm. In addition, n layer 206 may be formed by selectively growing the crystal again after a step of dry etching for p layer 205. Alternatively, n layer 206 may be formed by implanting Si ions after forming an undoped GaN layer and performing an activation annealing process. Ohmic electrodes are formed for p layer 205 and n layer 206, and preferably made of Ni-based and Al-based electrode materials, respectively.

Furthermore, the conductivity types, and the specific values of the thicknesses and the carrier concentrations of the above nitride semiconductor device are similar to those in Table 3, and the configurations of the electrode metals are similar to those in Table 4.

Furthermore, as far as a desired potential can be applied to p layer 205 and n layer 206, p layer 205 or n layer 206 may be in contact with the electrode on an upper surface or a side surface of a finger or in a region other than an active region. In addition, a Schottky electrode may be formed on second layer 204 as anode electrode 211, and preferably made of Ni-based electrode material.

Here, pn light-emitting body 207 has at least p layer 205 and n layer 206. In this case, an intermediate layer made of undoped InAlGaN may exist between p layer 205 and n layer 206. A thickness of the InAlGaN intermediate layer made of InAlGaN is between 1 nm and 100 nm (inclusive), and preferably 10 nm. Furthermore, if bandgap energy of the undoped InAlGaN intermediate layer is set lower than bandgap energy of p layer 205 and n layer 206, pn light-emitting body 207 may have a quantum well configuration. Thus, pn light-emitting body 207 can be improved in emission efficiency due to a confinement effect to the quantum well. When a voltage higher than a threshold voltage of a forward bias between the pn junctions is applied, pn light-emitting body 207 having at least p layer 205 and n layer 206 emits a light beam having a light emission wavelength corresponding to its bandgap energy.

According to the nitride semiconductor device in this exemplary embodiment, in the case where the two-terminal diode is provided, similarly to the above, by irradiating electrons trapped in a trapping level between the anode and the cathode with a light beam having energy higher than activation energy of the trapping level, the trapped electrons can be excited and released from the trap.

Fifth Exemplary Embodiment

Figure 12:
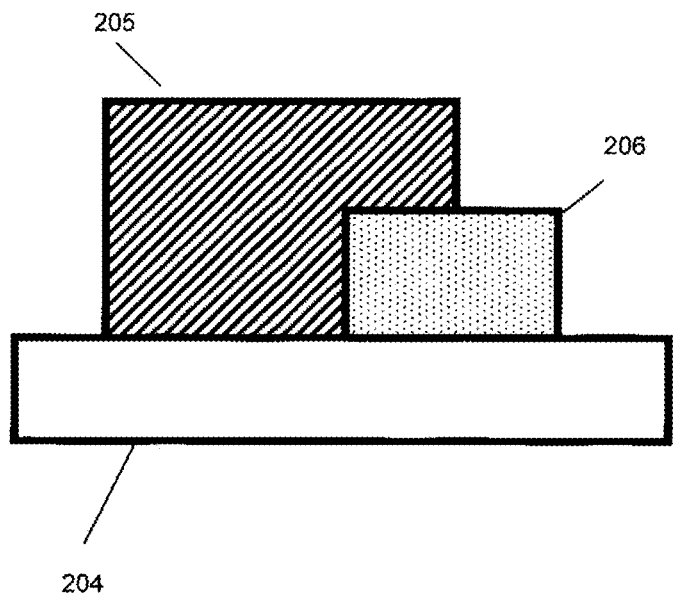
FIG. 12 is a schematic view showing a pn light-emitting body part of a nitride semiconductor device in a fifth exemplary embodiment.

FIG. 12 is a schematic view showing a configuration of a pn light-emitting body part in a nitride semiconductor device according to the fifth exemplary embodiment. The nitride semiconductor device in this exemplary embodiment is a Schottky diode (SD). According to this exemplary embodiment, a configuration of pn light-emitting body 207 differs from that of the semiconductor device (FIG. 11) in the fourth exemplary embodiment, but configurations of substrate 201, buffer layer 202, first layer 203 and the like are similar to those in the fourth exemplary embodiment (refer to Table 3 and Table 4).

Here, p layer 205 is formed on second layer 204. In addition, p layer 205 is made of p-type InAlGaN doped with magnesium (Mg), and preferably made of p-type GaN. A thickness of p layer 205 is between 10 nm and 400 nm (inclusive) which is lower than a height of an upper surface of anode electrode 211 or cathode electrode 212, and preferably 100 nm. A hole concentration of p layer 205 is desirably $1\times10^{16}$ cm$^{-3}$ to $1\times10^{19}$ cm$^{-3}$.

Furthermore, the conductivity types, and the specific values of the thicknesses and the carrier concentrations of the above nitride semiconductor device are similar to those in Table 3, and configurations of the electrode metals are similar to those in Table 4.

Here, pn light-emitting body 207 has p layer 205 and n layer 206. A lower surface of n layer 206 is in contact with second layer 204. In this case, when n layer 206 is epitaxially grown, n layer 206 having less crystal defects can be formed. In addition, p layer 205 and n layer 206 are in contact with each other on two surfaces. The junction surfaces are an upper surface of n layer 206 and a side surface closer to anode electrode 211 of n layer 206. Thus, light beams having the same light emission wavelength are emitted from the two junction surfaces between p layer 205 and n layer 206 (pn junctions) in directions parallel to the junction surfaces. Due to this configuration, the light beams can be emitted from one pn light-emitting body 207 in the plurality of directions, so that the electrons trapped in a plurality of regions can be simultaneously released and the current collapse can be efficiently prevented. This effect can be noticeably obtained in a case where pn light-emitting body 207 has an intermediate layer. This is because the light beams from pn light-emitting body 207 can be totally reflected and confined by use of a difference in refractive index between the intermediate layer, and p layer 205 and n layer 206.

First Variation of Fifth Exemplary Embodiment

Figure 13:
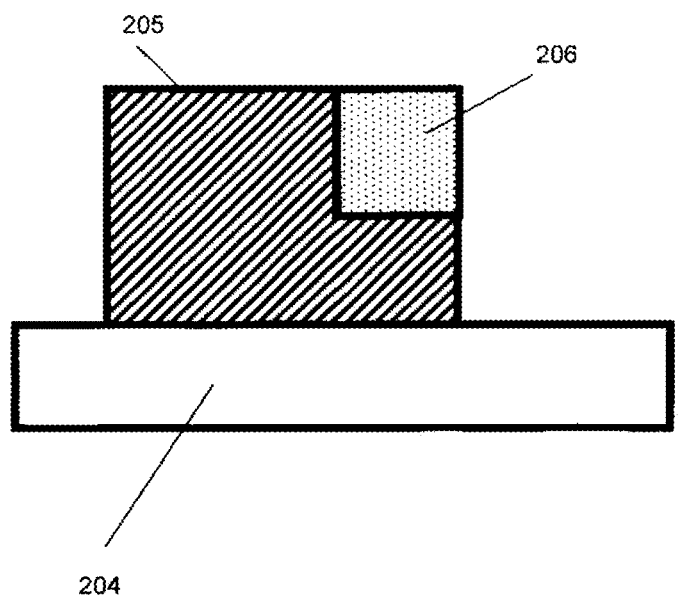
FIG. 13 is a schematic view showing a pn light-emitting body part of a nitride semiconductor device in a first variation of the fifth exemplary embodiment.

FIG. 13 is a schematic view showing a pn light-emitting body part in a nitride semiconductor device according to the first variation of the fifth exemplary embodiment. The nitride semiconductor device in this exemplary embodiment is a Schottky diode (SD). According to this variation, a configuration of pn light-emitting body 207 differs from that of the semiconductor device (FIG. 12) in the fifth exemplary embodiment, but configurations of substrate 201, buffer layer 202, first layer 203 and the like are similar to those in the fifth exemplary embodiment (refer to Table 3 and Table 4).

Here, p layer 205 and n layer 206 are formed on second layer 204. In addition, n layer 206 may be formed by selectively growing the crystal again after a step of dry etching for p layer 205. Alternatively, n layer 206 may be formed by implanting Si ions after forming an undoped GaN layer and performing an activation annealing process.

Thus, pn light-emitting body 207 has p layer 205 and n layer 206. A lower surface of n layer 206 is not in contact with second layer 204. When n layer 206 is formed by ion implantation, an epitaxial growth step can be omitted. In addition, p layer 205 and n layer 206 are in contact with each other on two surfaces. The junction surfaces are a lower surface of n layer 206 and a side surface closer to anode electrode 211 of n layer 206. Thus, light beams having the same light emission wavelength are emitted from the two junction surfaces between p layer 205 and n layer 206 (pn junctions) in directions parallel to the junction surfaces. Due to this configuration, the light beams can be emitted from one pn light-emitting body 207 in a plurality of directions, so that the electrons trapped in a plurality of regions can be simultaneously released and the current collapse can be efficiently prevented. This effect can be noticeably obtained in a case where pn light-emitting body 207 has an intermediate layer. This is because the light beams from pn light-emitting body 207 can be totally reflected and confined by use of a difference in refractive index between the intermediate layer, and p layer 205 and n layer 206.

As described above, since the nitride semiconductor device in this exemplary embodiment includes pn light-emitting body 207 serving as the light emission source in an active region of a unit cell in the transistor, the electrons trapped in the plurality of regions can be simultaneously released and the current collapse can be efficiently prevented without increasing a chip size.

Sixth Exemplary Embodiment

Figure 14:
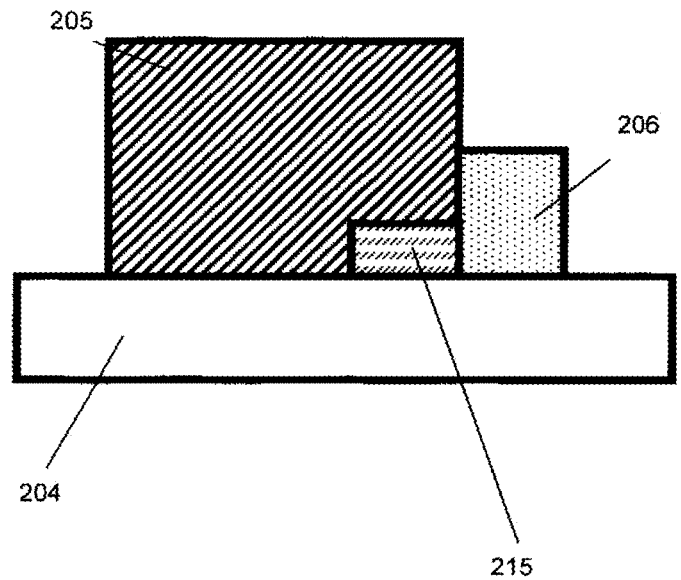
FIG. 14 is a schematic view showing a pn light-emitting body part of a nitride semiconductor device in a sixth exemplary embodiment.

FIG. 14 is a schematic view showing a configuration of a pn light-emitting body part of a nitride semiconductor device according to the sixth exemplary embodiment. The nitride semiconductor device in this exemplary embodiment is a Schottky diode (SD). The semiconductor device in this exemplary embodiment differs from the semiconductor device (FIG. 11) in the fourth exemplary embodiment in that pn light-emitting body 207 has intermediate layer 215. In addition, configurations of substrate 201, buffer layer 202, first layer 203 and the like are similar to those in the fourth exemplary embodiment (refer to Table 3 and Table 4).

Here, pn light-emitting body 207 has p layer 205 and n layer 206, and p layer 205 and intermediate layer 215 are in contact with each other on two surfaces. The junction surfaces are an upper surface of intermediate layer 215 and a side surface, closer to anode electrode 211, of intermediate layer 215. A lower surface of intermediate layer 215 is in contact with second layer 204. Furthermore, p layer 205 is in contact with n layer 206 on its side surface closer to cathode electrode 212. In addition, intermediate layer 215 is in contact with n layer 206 on its side surface closer to cathode electrode 212. A first light beam is emitted from a junction surface (pn junction) between p layer 205 and n layer 206. A second light beam is emitted from a junction surface (p-i-n junction) between p layer 205, intermediate layer 215, and n layer 206. A light emission wavelength of the first light beam is different from that of the second light beam. The first light beam is emitted parallel to the junction surface. The second light beam is emitted in a direction parallel to an opposed surface of p layer 205 and n layer 206. Due to this configuration, the light beams having the plurality of wavelengths can be emitted from one pn light-emitting body 207, so that the electrons trapped in a plurality of levels having the activation energy can be simultaneously released and the current collapse can be efficiently prevented. Preferably, pn light-emitting body 207 partially has intermediate layer 215. Alternatively, p layer 205 preferably has a plurality of p layers having different bandgaps, or n layer 206 preferably has a plurality of n layers having different bandgaps. This effect can be noticeably obtained in a case where pn light-emitting body 207 has an intermediate layer. This is because the light beams from pn light-emitting body 207 can be totally reflected and confined by use of a difference in refractive index between the intermediate layer, and p layer 205 and n layer 206.

First Variation of Sixth Exemplary Embodiment

Figure 15:
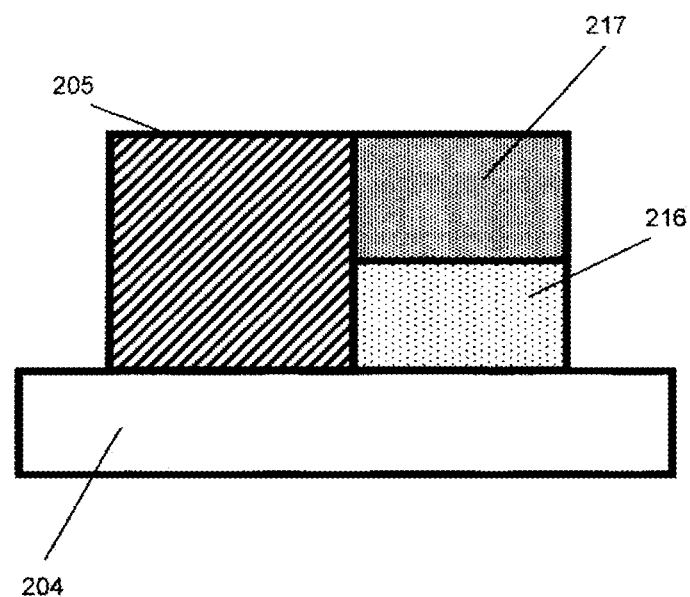
FIG. 15 is a schematic view showing a pn light-emitting body part of a nitride semiconductor device in a first variation of the sixth exemplary embodiment.

FIG. 15 is a schematic view showing a pn light-emitting body part in a nitride semiconductor device according to the first variation of the sixth exemplary embodiment. In this variation, a configuration of pn light-emitting body 207 differs from that of the semiconductor device (FIG. 14) in the sixth exemplary embodiment, but configurations of substrate 201, buffer layer 202, first layer 203 and the like are similar to those in the sixth exemplary embodiment (refer to Table 3 and Table 4).

Furthermore, p layer 205, first n layer 216, and second n layer 217 are formed on second layer 204. In addition, first n layer 216 has a composition different from second n layer 217, so that they have different bandgap energy. First n layer 216 and second n layer 217 may be formed by selectively growing the crystal again after a step of dry etching for p layer 205. Alternatively, first n layer 216 and second n layer 217 may be formed by implanting Si ions after forming an undoped GaN layer and performing an activation annealing process.

Here, pn light-emitting body 207 has p layer 205, first n layer 216, and second n layer 217. In addition, p layer 205 is in contact with first n layer 216 on its side surface closer to cathode electrode 212. Furthermore, p layer 205 is in contact with second n layer 217 on its side surface closer to cathode electrode 212. A lower surface of second n layer 217 is in contact with an upper surface of first n layer 216. A lower surface of first n layer 216 is in contact with second layer 204. A third light beam is emitted from a junction surface between p layer 205 and first n layer 216 (first pn junction). A fourth light beam is emitted from a junction surface between p layer 205 and second n layer 217 (second pn junction). A light emission wavelength of the third light beam is different from that of the fourth light beam. The third light beam is emitted parallel to the junction surface. The fourth light beam is emitted parallel to the junction surface. Due to this configuration, the light beams having the plurality of wavelengths can be emitted from one pn light-emitting body 207, so that the electrons trapped in a plurality of levels can be simultaneously released and the current collapse can be efficiently prevented. This effect can be noticeably obtained in a case where pn light-emitting body 207 has an intermediate layer. This is because the light beams from pn light-emitting body 207 can be totally reflected and confined by use of a difference in refractive index between the intermediate layer, and p layer 205, first n layer 216, and second n layer 217.

As described above, since the nitride semiconductor device in this exemplary embodiment includes pn light-emitting body 207 serving as the light emission source in an active region of a unit cell in the transistor, electrons trapped in a plurality of levels can be simultaneously released, and the current collapse can be efficiently prevented without increasing a chip size.

Seventh Exemplary Embodiment

Figure 16:
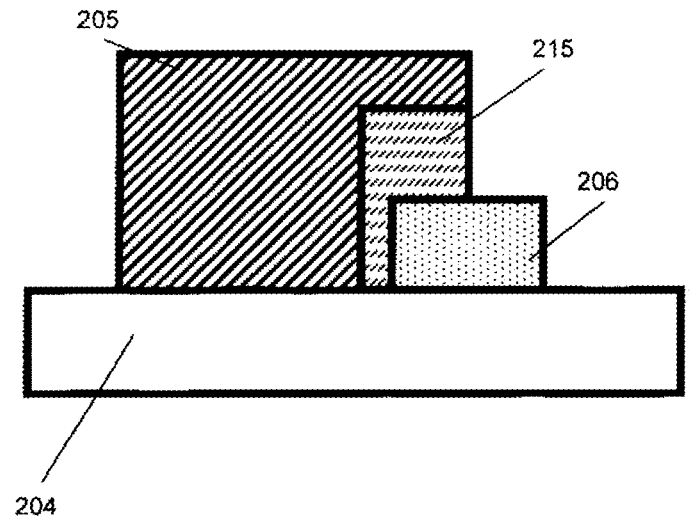
FIG. 16 is a schematic view showing a pn light-emitting body part of a nitride semiconductor device in a seventh exemplary embodiment.

FIG. 16 is a schematic view showing a configuration of a pn light-emitting body part in a nitride semiconductor device according to the seventh exemplary embodiment. The nitride semiconductor device in this exemplary embodiment is a Schottky diode (SD). The semiconductor device in this exemplary embodiment differs from the semiconductor device (FIG. 11) in the fourth exemplary embodiment in that pn light-emitting body 207 has intermediate layer 215. In addition, configurations of substrate 201, buffer layer 202, first layer 203 and the like are similar to those in the fourth exemplary embodiment (refer to Table 3 and Table 4).

Here, p layer 205 and n layer 206 have different bandgaps. In addition, pn light-emitting body 207 has p layer 205 and n layer 206. Furthermore, p layer 205 and intermediate layer 215 are in contact with each other on two surfaces. The junction surfaces are an upper surface of intermediate layer 215 and a side surface, closer to anode electrode 211, of intermediate layer 215. Furthermore, intermediate layer 215 and n layer 206 are in contact with each other on two surfaces. The junction surfaces are an upper surface of n layer 206 and a side surface, closer to anode electrode 211, of n layer 206. A lower surface of p layer 205, a lower surface of intermediate layer 215, and a lower surface of n layer 206 are in contact with an upper surface of second layer 204. In this configuration, light beams are emitted from intermediate layer 215 in two directions parallel to the side surface and the upper surface. A first light beam is emitted through the junction surface between the lower surface of intermediate layer 215 and second layer 204. A second light beam is emitted through the side surface, closer to a cathode, of intermediate layer 215. A wavelength of the first light beam is smaller than a wavelength of the second light beam. The smaller the wavelength of the light beam is, the more the electrons trapped in defects having many levels can be released. Due to this configuration, electrons trapped in a deep level in a direction of the first light beam, and electrons trapped in a shallow level in a direction of the second light beam can be simultaneously released, and the current collapse can be efficiently prevented. Preferably, pn light-emitting body 207 partially has the intermediate layer. Alternatively, p layer 205 preferably has a plurality of p layers having different bandgaps, or n layer 206 preferably has a plurality of n layers having different bandgaps. This effect can be noticeably obtained in the case where pn light-emitting body 207 has the intermediate layer. This is because the light beams from pn light-emitting body 207 can be totally reflected and confined by use of a difference in refractive index between the intermediate layer, and p layer 205 and n layer 206.

First Variation of Seventh Exemplary Embodiment

Figure 17:
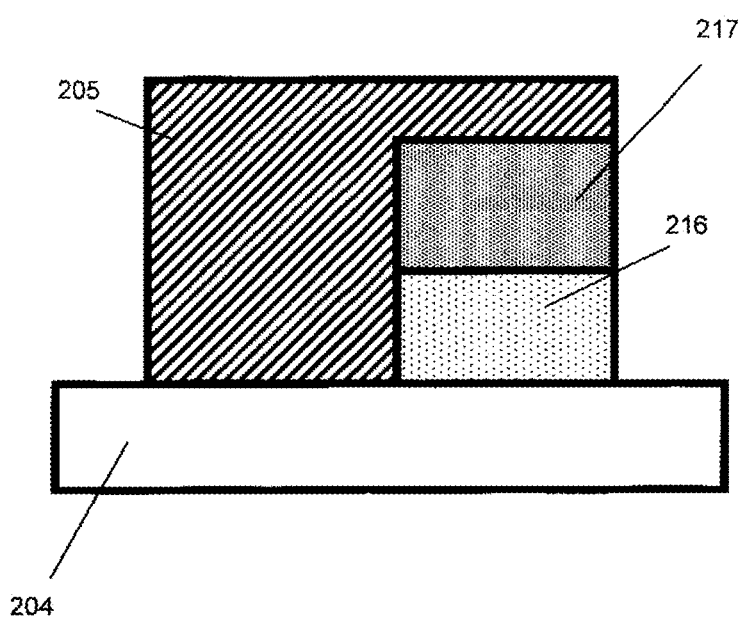
FIG. 17 is a schematic view showing a pn light-emitting body part of a nitride semiconductor device in a first variation of the seventh exemplary embodiment.

FIG. 17 is a schematic view showing a pn light-emitting body part in a nitride semiconductor device according to the first variation of the seventh exemplary embodiment. A configuration of pn light-emitting body 207 in this variation differs from that of the semiconductor device (FIG. 16) in the seventh exemplary embodiment, but configurations of substrate 201, buffer layer 202, first layer 203 and the like are similar to those in the seventh exemplary embodiment (refer to Table 3 and Table 4).

Furthermore, p layer 205, first n layer 216, and second n layer 217 are formed on second layer 204. In addition, first n layer 216 has a composition different from second n layer 217, so that they have different bandgap energy. First n layer 216 and second n layer 217 may be formed by selectively growing the crystal again after a step of dry etching for p layer 205. Alternatively, first n layer 216 and second n layer 217 may be formed by implanting Si ions after forming an undoped GaN layer and performing an activation annealing process.

Here, pn light-emitting body 207 has p layer 205, first n layer 216, and second n layer 217. In addition, p layer 205 is in contact with first n layer 216 on its side surface closer to cathode electrode 212. Furthermore, a lower surface of first n layer 216 is in contact with an upper surface of second layer 204.

Furthermore, p layer 205 and second n layer 217 are in contact with each other on two surfaces. The junction surfaces are an upper surface of second n layer 217 and a side surface, closer to anode electrode 211, of second n layer 217. Furthermore, a lower surface of second n layer 217 is in contact with an upper surface of first n layer 216. A third light beam is emitted from a junction surface between p layer 205 and first n layer 216 (first pn junction), in a direction parallel to the junction surface. A fourth light beam is emitted from a junction surface between p layer 205 and the side surface of second n layer 217 (second pn junction), in a direction parallel to the junction surface. A fifth light beam is emitted from a junction surface between p layer 205 and the upper surface of second n layer 217 (second pn junction), in a direction parallel to the junction surface.

A wavelength of the third light beam is smaller than wavelengths of the fourth light beam and the fifth light beam. The smaller the wavelength of the light beam is, the more the electrons trapped in defects having many levels can be released. Due to this configuration, electrons trapped in a deep level in directions of the third light beam and the fourth light beam, and electrons trapped in a shallow level in a direction of the fifth light beam can be simultaneously released, and the current collapse can be efficiently prevented. Due to this configuration, the light beams having the plurality of directions and wavelengths can be emitted from one pn light-emitting body 207, so that the electrons trapped in a plurality of levels in a plurality of regions can be simultaneously released and the current collapse can be efficiently prevented. This effect can be noticeably obtained in a case where pn light-emitting body 207 has an intermediate layer. This is because the light beams from pn light-emitting body 207 can be totally reflected and confined by use of a difference in refractive index between the intermediate layer, and p layer 205, first n layer 216, and second n layer 217.

As described above, since the nitride semiconductor device in this exemplary embodiment includes pn light-emitting body 207 serving as the light emission source in an active region of a unit cell in the transistor, the electrons trapped in the levels in a plurality of regions can be simultaneously released, and the current collapse can be efficiently prevented without increasing a chip size.

What is claimed is:

1. A nitride semiconductor device comprising:
a field effect transistor having: a semiconductor stacked body formed on a substrate, and including a first nitride semiconductor layer, and a second nitride semiconductor layer formed on the first nitride semiconductor layer and having a bandgap wider than that of the first nitride semiconductor layer; a source electrode and a drain electrode formed away from each other on the semiconductor stacked body; and a gate electrode provided between the source electrode and the drain electrode and formed away from the source electrode and the drain electrode; and
a pn light-emitting body formed on the semiconductor stacked body, and including a p-type nitride semiconductor layer and an n-type nitride semiconductor layer to emit a light beam having an energy value higher than an electron trapping level existing in the semiconductor stacked body, wherein:
the p-type nitride semiconductor layer of the pn light-emitting body is electrically connected to the gate electrode, and functions as a gate of the field effect transistor,
the pn light-emitting body has one or more facing surface pairs each consisting of a first surface of the p-type nitride semiconductor layer and a second surface of the n-type nitride semiconductor layer which faces the first surface, and
each of the first surface and the second surface in at least one pair of the facing surface pairs is formed so as to extend in a direction perpendicular to an upper surface of the substrate.

2. The nitride semiconductor device according to claim 1, wherein a crystal plane orientation of the first surface in the one pair of the facing surface pairs is different from a crystal plane orientation of the first surface in another pair of the facing surface pairs.

3. The nitride semiconductor device according to claim 1, wherein:
a crystal plane orientation of the first surface in the one pair of the facing surface pairs is different from a crystal plane orientation of the first surface in an another pair of the facing surface pairs, and
an energy value of a light beam emitted from the one pair of the facing surface pairs is different from an energy value of a light beam emitted from the another pair of the facing surface pairs.

4. The nitride semiconductor device according to claim 1, wherein the gate electrode is in direct contact with the pn light-emitting body only at a face of the p-type nitride semiconductor layer.

5. A nitride semiconductor device comprising:
a field effect transistor having: a semiconductor stacked body formed on a substrate, and including a first nitride semiconductor layer, and a second nitride semiconductor layer formed on the first nitride semiconductor layer and having a bandgap wider than that of the first nitride semiconductor layer; a source electrode and a drain electrode formed away from each other on the semiconductor stacked body; and a gate electrode provided between the source electrode and the drain electrode and formed away from the source electrode and the drain electrode; and
a pn light-emitting body formed between the gate electrode and the drain electrode on the semiconductor stacked body, and including a p-type nitride semiconductor layer and an n-type nitride semiconductor layer to emit a light beam having an energy value higher than an electron trapping level existing in the semiconductor stacked body, wherein:
the p-type nitride semiconductor layer of the pn light-emitting body is electrically connected to the drain electrode, and is controlled to a potential substantially equal to a potential of the drain electrode,
the pn light-emitting body has one or more facing surface pairs each consisting of a first surface of the p-type nitride semiconductor layer and a second surface of the n-type nitride semiconductor layer which faces the first surface, and
each of the first surface and the second surface in at least one pair of the facing surface pairs is formed so as to extend in a direction perpendicular to an upper surface of the substrate.

6. The nitride semiconductor device according to claim 5, wherein a crystal plane orientation of the first surface in the one pair of the facing surface pairs is different from a crystal plane orientation of the first surface in another pair of the facing surface pairs.

7. The nitride semiconductor device according to claim 5, wherein:
a crystal plane orientation of the first surface in the one pair of the facing surface pairs is different from a crystal plane orientation of the first surface in an another pair of the facing surface pairs, and
an energy value of a light beam emitted from the one pair of the facing surface pairs is different from an energy value of a light beam emitted from the another pair of the facing surface pairs.

8. The nitride semiconductor device according to claim 5, wherein:
an electrode electrically connected to the drain electrode is provided on the pn light-emitting body, and
the electrode is in direct contact with the pn light-emitting body only at a face of the p-type nitride semiconductor layer.

9. A nitride semiconductor device comprising:
a field effect transistor having: a semiconductor stacked body formed on a substrate, and including a first nitride semiconductor layer, and a second nitride semiconductor layer formed on the first nitride semiconductor layer and having a bandgap wider than that of the first nitride semiconductor layer; a source electrode and a drain electrode formed away from each other on the semiconductor stacked body; and a gate electrode provided between the source electrode and the drain electrode and formed away from the source electrode and the drain electrode; and
a light-emitting body formed on the semiconductor stacked body, and including a p-type nitride semiconductor layer and an n-type nitride semiconductor layer to emit a light beam having an energy value higher than an electron trapping level existing in the semiconductor stacked body, wherein:
the p-type nitride semiconductor layer of the light-emitting body is electrically connected to either one of the gate electrode or the drain electrode, and
the p-type nitride semiconductor layer includes at least one face opposing to the n-type nitride semiconductor layer, and the at least one face is perpendicular to an upper surface of the substrate.

10. The nitride semiconductor device of claim 9, wherein an interface between the p-type nitride semiconductor layer and the n-type nitride semiconductor layer includes a vertical interface which is perpendicular to an upper surface of the substrate.

\* \* \* \* \*